US012701981B2

(12) United States Patent
Fukumaki et al.

(10) Patent No.: US 12,701,981 B2
(45) Date of Patent: Aug. 4, 2026

(54) SEMICONDUCTOR DEVICE AND SEMICONDUCTOR MEMORY DEVICE, AND METHOD FOR MANUFACTURING SEMICONDUCTOR DEVICE

(71) Applicant: Kioxia Corporation, Tokyo (JP)

(72) Inventors: Naomi Fukumaki, Yokkaichi (JP); Ayaka Sakai, Fujisawa (JP); Takayuki Beppu, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 724 days.

(21) Appl. No.: 17/687,138

(22) Filed: Mar. 4, 2022

(65) Prior Publication Data

US 2023/0064038 A1      Mar. 2, 2023

(30) Foreign Application Priority Data

Sep. 2, 2021     (JP) ................................. 2021-143429

(51) Int. Cl.
| | |
|---|---|
| *H10W 20/42* | (2026.01) |
| *H10B 41/27* | (2023.01) |
| *H10B 43/27* | (2023.01) |
| *H10W 20/44* | (2026.01) |

(52) U.S. Cl.
CPC ............ *H10W 20/42* (2026.01); *H10B 41/27* (2023.02); *H10B 43/27* (2023.02); *H10W 20/4441* (2026.01)

(58) Field of Classification Search
CPC ........... H01L 23/5226; H01L 23/53257; H01L 29/40117; H01L 29/495; H10B 41/27; H10B 43/27; H10B 43/10
See application file for complete search history.

(56) References Cited

U.S. PATENT DOCUMENTS

| | | | | |
|---|---|---|---|---|
| 9,570,464 | B1 * | 2/2017 | Wakatsuki | ............ H01L 21/764 |
| 10,615,334 | B2 * | 4/2020 | Umebayashi | ........... G11C 11/16 |
| 11,107,675 | B2 | 8/2021 | Baum et al. | |
| 11,784,119 | B2 * | 10/2023 | Hu | .................... H01L 21/02645 |
| | | | | 257/499 |
| 2012/0080756 | A1 * | 4/2012 | Suzuki | ................... C23C 16/34 |
| | | | | 257/369 |
| 2012/0273863 | A1 | 11/2012 | Ozawa et al. | |
| 2013/0037876 | A1 * | 2/2013 | Omoto | ................... H10B 41/48 |
| | | | | 257/315 |
| 2013/0099230 | A1 | 4/2013 | Yamazaki et al. | |

(Continued)

FOREIGN PATENT DOCUMENTS

| | | |
|---|---|---|
| JP | 2019-527302 A | 9/2019 |
| JP | 2020-029617 A | 2/2020 |

(Continued)

*Primary Examiner* — Jeff W Natalini

*Assistant Examiner* — Nicholas Leland Hutson

(74) *Attorney, Agent, or Firm* — Foley & Lardner LLP

(57) ABSTRACT

A semiconductor device includes a substrate and an insulating film formed on the substrate, and an electrode layer comprising molybdenum, formed in contact with the insulating film. The electrode layer has a chlorine concentration gradient such that a first concentration of chlorine in a first portion of the electrode layer closer to the insulating layer is higher than a second concentration of chlorine in a second portion of the electrode layer less closer to the insulating layer.

7 Claims, 9 Drawing Sheets

(56)         References Cited

U.S. PATENT DOCUMENTS

| | | | |
|---|---|---|---|
| 2018/0019165 A1 | 1/2018 | Baum et al. | |
| 2018/0286668 A1 | 10/2018 | Baum et al. | |
| 2019/0067014 A1 | 2/2019 | Shrestha et al. | |
| 2020/0105942 A1* | 4/2020 | Ito | H10D 30/6756 |
| 2020/0243375 A1 | 7/2020 | Kang et al. | |
| 2021/0066468 A1 | 3/2021 | Beppu et al. | |
| 2021/0238736 A1* | 8/2021 | Butail | C23C 16/14 |
| 2021/0272980 A1 | 9/2021 | Kashima | |
| 2024/0234152 A9* | 7/2024 | Schloss | H01L 21/28568 |

FOREIGN PATENT DOCUMENTS

| | | |
|---|---|---|
| JP | 2021-034591 A | 3/2021 |
| TW | 201724526 A | 7/2017 |
| TW | 202133265 A | 9/2021 |

* cited by examiner

*FIG. 9*

SEMICONDUCTOR DEVICE AND SEMICONDUCTOR MEMORY DEVICE, AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2021-143429, filed Sep. 2, 2021, the entire contents of which are incorporated herein by reference.

FIELD

Embodiments described herein relate generally to a semiconductor device and a semiconductor memory device, and a method for manufacturing the semiconductor device.

BACKGROUND

A semiconductor device may have a three-dimensional structure, which includes a stacked body. The stacked body generally includes conductive layers and insulating layers stacked on top of one another, and columnar portions penetrating the stacked body.

Further, the semiconductor device may include an electrode layer comprising molybdenum. Such an electrode layer has small crystal grains and many crystal grain boundaries. Accordingly, diffusion of an impurity element through the crystal grain boundaries during a manufacturing process of the semiconductor device may be a concern.

DESCRIPTION OF THE DRAWINGS

FIG. 9 is a graph showing the results of an evaluation of the grain size of crystal grains constituting an electrode layer.

DETAILED DESCRIPTION

Figure 1:
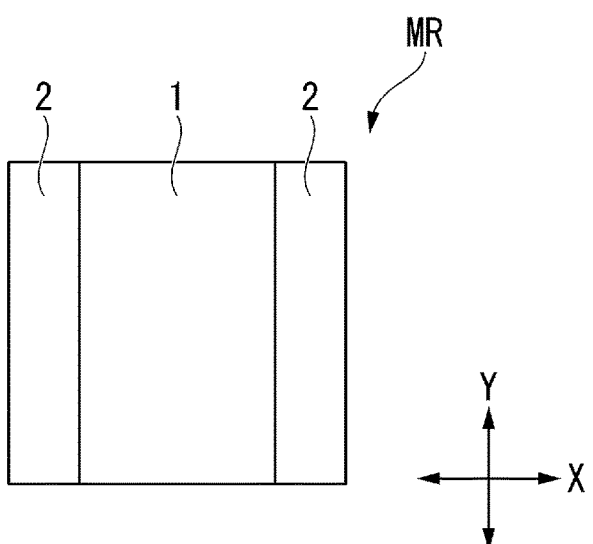
FIG. 1 is a schematic plan view of a semiconductor memory device according to a first embodiment.

Embodiments provide a semiconductor device, a semiconductor memory device and a method for manufacturing the semiconductor device, which make it possible to prevent diffusion of an impurity element, thereby enhancing properties.

According to one embodiment, a semiconductor device includes a substrate and an insulating film formed on the substrate, and an electrode layer comprising molybdenum, formed in contact with the insulating film. The electrode layer has a chlorine concentration gradient such that a first concentration of chlorine in a first portion of the electrode layer closer to the insulating layer is higher than a second concentration of chlorine in a second portion of the electrode layer less closer to the insulating layer.

First Embodiment

A semiconductor memory device according to a first embodiment will now be described with reference to the drawings.

In the drawings and the description below, same symbols are used for components or elements having the same or similar functions, and a duplicate description thereof may be omitted. As used herein, the term "connection" is not limited to physical connection, and includes electrical connection. As used herein, the expression "xx faces yy" is not limited to a case where xx is in contact with yy, and include a case where another member intervenes between xx and yy. As used herein, the expression "xx is provided on yy" is not limited to a case where xx is in contact with yy, and include a case where another member intervenes between xx and yy. The expression "xx is provided on yy" is irrelevant to the direction of gravitational force. As used herein, the terms "parallel" and "perpendicular" include "approximately parallel" and "approximately perpendicular", respectively.

Figure 3:
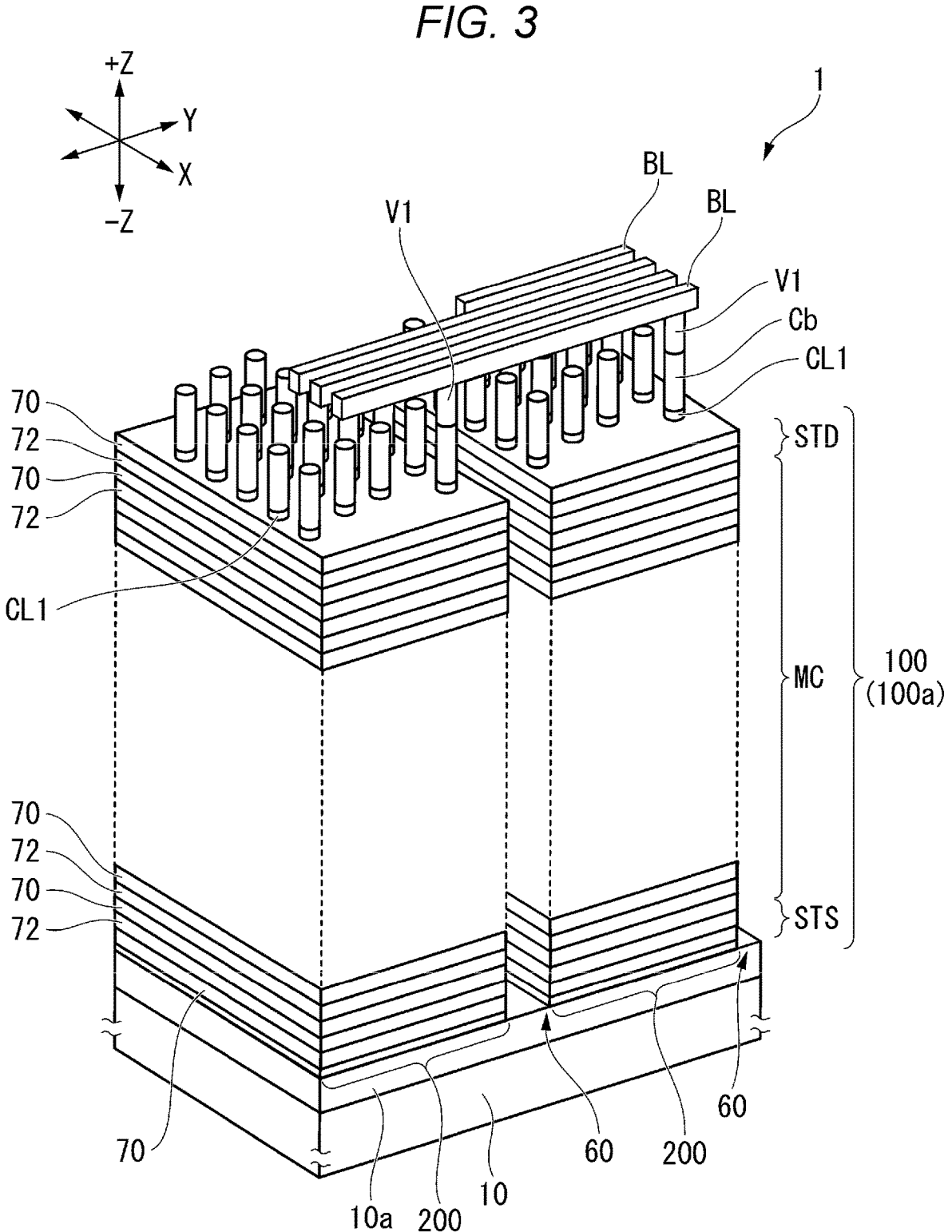
FIG. 3 is a schematic perspective view of the cell array region of the semiconductor memory device according to the first embodiment.

X direction, Y direction and Z direction will now be defined. X direction and Y direction each refer to a direction parallel to the surface of the below-described semiconductor substrate 10 (see FIG. 3). The X direction and the Y direction intersect each other (for example, at right angles). The Y direction coincides with the direction in which the below-described bit lines BL (see FIG. 3) extend. Z direction (first direction) intersects (for example, at right angles) the X direction and the Y direction, and coincides with the thickness direction of the semiconductor substrate 10. As shown in FIG. 3, the terms "+Z direction" and "−Z direction" may sometimes be used to refer to "upward" and "downward", respectively. The +Z direction and the −Z direction differ from each other by 180 degrees. It is to be noted, however, that these expressions are for the sake of expediency and are irrelevant to the direction of gravitational force.

<Overall Configuration of Semiconductor Memory Device>

FIG. 1 is a schematic plan view of a semiconductor memory device (semiconductor device) MR according to a first embodiment.

The semiconductor memory device MR of the first embodiment includes a memory cell array 1 and a plurality of staircase portions 2 provided in a peripheral region located outside the memory cell array 1. The memory cell array 1 and the staircase portions 2 are provided on the same semiconductor substrate.

Figure 2:
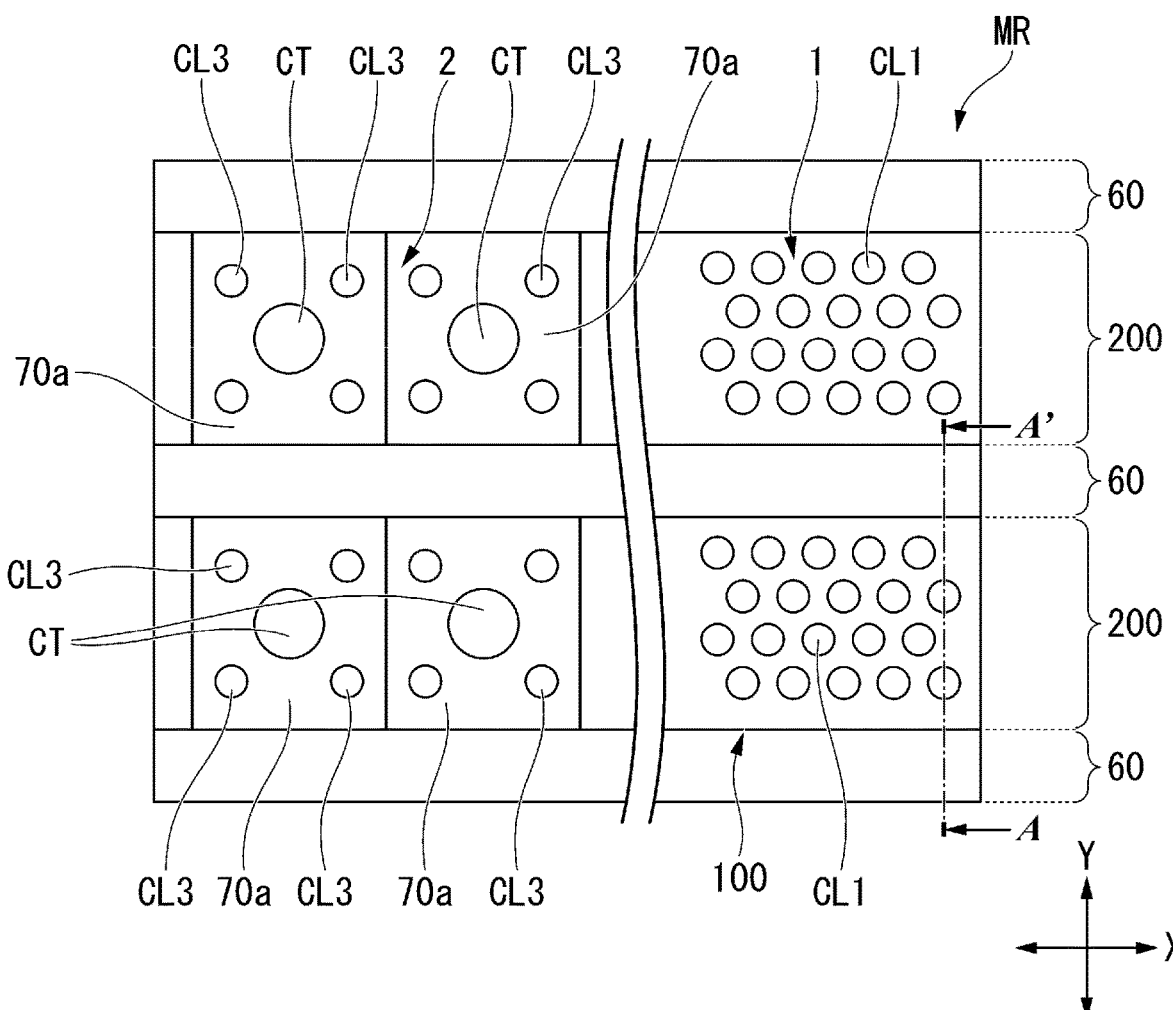
FIG. 2 is a schematic plan view of a cell array region of the semiconductor memory device according to the first embodiment.
Figure 4:
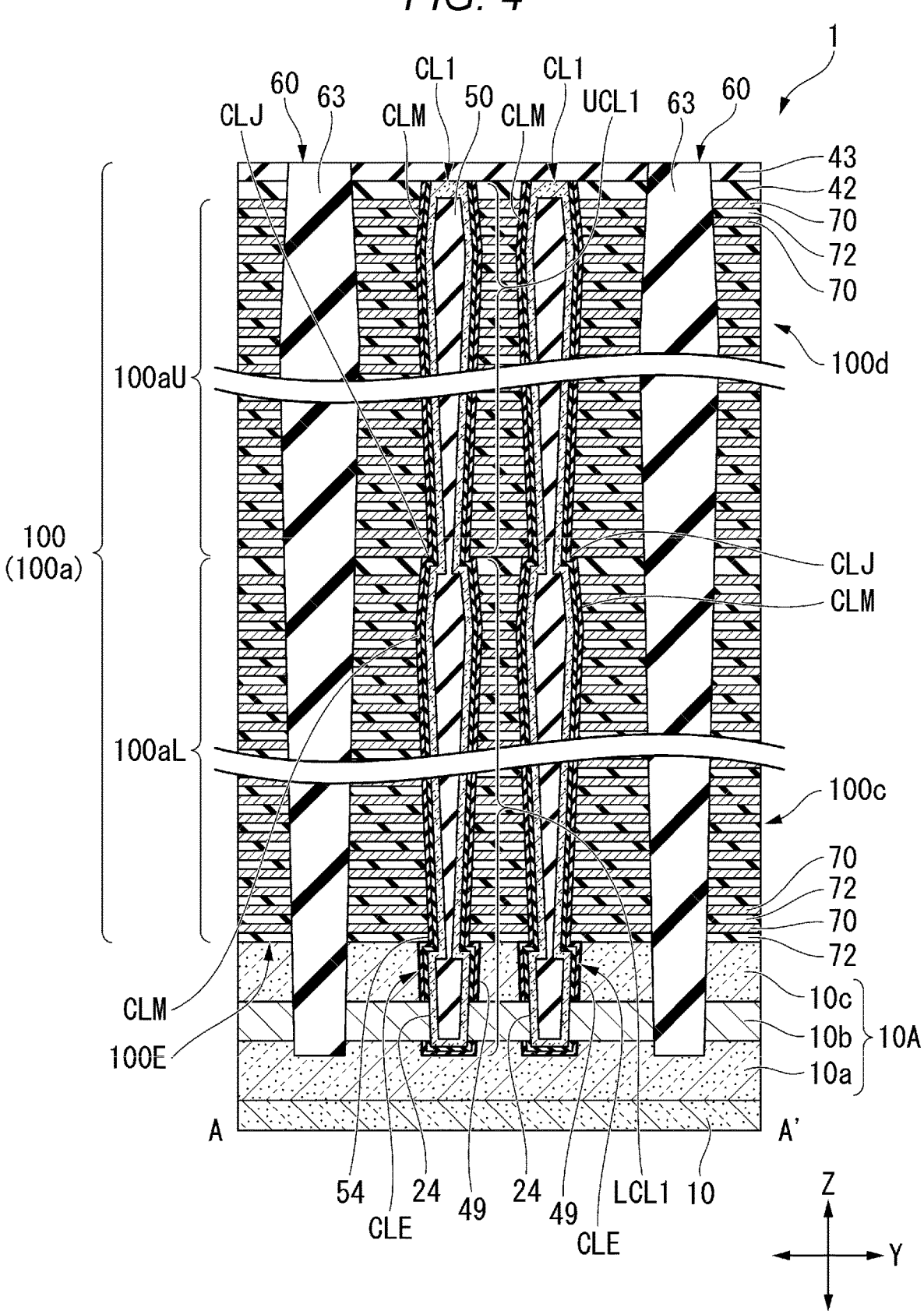
FIG. 4 is a cross-sectional view along the line A-A' of FIG. 2, illustrating the stacked body and the columnar portions provided in the cell array region shown in FIG. 2.

FIG. 2 is a schematic enlarged plan view of the memory cell array 1 and the staircase portions 2 of the semiconductor memory device MR according to the first embodiment. FIG. 3 is a schematic perspective view of the memory cell array 1. FIG. 4 is a cross-sectional view along the line A-A' of FIG. 2, illustrating the stacked body 100 and the columnar portions CL1 shown in FIG. 2.

As shown in FIGS. 2 through 4, the memory cell array 1 includes part of the semiconductor substrate 10, part of the stacked body 100 provided on the semiconductor substrate 10, a plurality of columnar portions CL1, a plurality of insulating portions 60, and upper interconnects provided above the stacked body 100. FIG. 3 shows bit lines BL as example upper interconnects.

The semiconductor substrate 10 and the stacked body 100 are provided over a cell array region where the memory cell array 1 is provided, and a staircase region where the staircase portions 2 are provided. The portion of the stacked body 100 which is provided in the cell array region is referred to as a first stacked portion 100a (see FIGS. 3 and 4). The columnar portions CL1 are disposed in the cell array region. The columnar portions CL1 each have a circular cylindrical shape extending in the first stacked portion 100a in the stacking direction (Z direction).

As shown in FIG. 2, the columnar portions CL1 are arranged, for example, in a zigzag pattern. Alternatively, the columnar portions CL1 may be arranged in a matrix pattern in the X and Y directions. The insulating portions 60 extend in the X direction in the cell array region and the staircase region, and divide the stacked body 100 in the Y direction into a plurality of string units 200. Each string unit 200 includes a cell array region and a staircase region.

As shown in FIG. 3, the bit lines BL are provided above the first stacked portion 100a. The bit lines BL are, for example, metal films extending in the Y direction. The bit lines BL are separated from each other in the X direction. The upper end of the below-described semiconductor body 20 of each columnar portion CL1 is connected to a bit line BL via a contact Cb and a contact V1. A plurality of columnar portions CL1 are connected to one common bit line BL. The plurality of columnar portions CL1, connected to the one common bit line BL, include columnar portions CL1 which are each selected from each of the string units 200 separated by the insulating portions 60 in the Y direction.

As shown in FIG. 4, the first stacked portion 100a includes a plurality of electrode layers 70 stacked on the semiconductor substrate 10. The electrode layers 70 are stacked, each via an insulating layer 72, in a direction (Z direction) perpendicular to the upper surface of the semiconductor substrate 10.

Each electrode layer 70 is, for example, a molybdenum layer.

Each insulating layer 72 is, for example, a silicon oxide layer.

In FIG. 3, the first stacked portion 100a is depicted as a simple stack structure composed of the electrode layers 70 and the insulating layers 72. Precisely, however, in order to provide a semiconductor memory device having a high-level stacked structure, a structure as shown in FIG. 4, in which a plurality of groups are vertically stacked in the Z direction, is employed in the first stacked portion 100a.

In the embodiment illustrated in FIG. 4, the first stacked portion 100a has a grouped structure including two groups, a lower group 100aL and an upper group 100aU.

The lower group 100aL includes a lower stacked body 100c having a stack structure composed of electrode layers 70 and insulating layers 72. The lower stacked body 100c has a plurality of lower columnar portions LCL1 penetrating the lower stacked body 100c in the Z direction.

The upper group 100aU includes an upper stacked body 100d having a stack structure composed of electrode layers 70 and insulating layers 72. The upper stacked body 100d has a plurality of upper columnar portions UCL1 penetrating the upper stacked body 100d in the Z direction.

As described above, in a precise sense, each columnar portion CL1 has a stack structure composed of a lower columnar portion LCL1 and an upper columnar portion UCL1. A joint CLJ is formed at the boundary between the lower columnar portion LCL1 and the upper columnar portion UCL1.

As shown in FIG. 4, the lower columnar portion LCL1 and the upper columnar portion UCL1 each have the shape of a column whose diameter decreases at a side closer to the semiconductor substrate, and gradually increases in a direction (Z direction) away from the semiconductor substrate 10. The lower columnar portion LCL1 and the upper columnar portion UCL1 each have a large-diameter portion CLM with the maximum diameter at a position slightly below (nearer to the semiconductor substrate 10) the topmost portion. The lower columnar portion LCL1 and the upper columnar portion UCL1 each have the shape of a column whose diameter gradually decreases in an upward direction away from the large-diameter portion CLM.

The shape of the lower columnar portion LCL1 and the shape of the upper columnar portion UCL1, illustrated in FIG. 4, are a non-limiting example. The lower columnar portion LCL1 and the upper columnar portion UCL1 may have any desired shape, for example, a columnar shape having a constant diameter or a columnar shape whose diameter gradually decreases from an upper side to a lower side.

In the following description, the columnar portion CL1, having a stack structure composed of the lower columnar portion LCL1 and the upper columnar portion UCL1, will be referred to simply as the columnar portion CL1 when such a wording can describe a function or structure.

While the columnar portion CL1 has a stack structure composed of the lower columnar portion LCL1 and the upper columnar portion UCL1 in the embodiment of FIG. 4, the columnar portion CL1 may be composed of a single columnar portion. Alternatively, the columnar portion CL1 may be composed of three or more columnar portions belonging to three or more groups. The shape of the columnar portion CL1 is not limited to a downwardly tapered shape; it is possible to use any shape, for example, a circular cylindrical shape having a constant outer diameter.

The semiconductor substrate 10 is a semiconductor substrate such as a silicon substrate. An interconnect layer region 10A is provided on the semiconductor substrate 10. The interconnect layer region 10A includes, for example, a semiconductor layer 10a, a source line 10b and a semiconductor layer 10c, which are stacked on the semiconductor substrate 10. A lower end portion CLE of each lower columnar portion LCL1 is embedded in the semiconductor layer 10a, the source line 10b and the semiconductor layer 10c. Thus, the lower end portion CLE of each lower columnar portion LCL1 is embedded in the interconnect layer region 10A. Details of the lower end portion CLE of the lower columnar portion LCL1 will be described later.

The semiconductor layers 10a, 10c are made of n-type silicon or the like, formed by implanting an impurity in a semiconductor such as silicon as a conductive material. In one example, the semiconductor layers 10a, 10c are made of phosphorus-doped polysilicon. The lower end of each lower columnar portion LCL1, from which films are partly removed as described below, is connected to the source line 10b. The source line 10b is comprised of a semiconductor layer or a conductive layer made of, for example, tungsten or tungsten silicide.

An insulating layer 72 is provided on the upper surface of the semiconductor layer 10c. The lowermost electrode layer 70 is provided on the insulating layer 72, and the insulating layers 72 and the electrode layers 70 are stacked alternately. An insulating layer 42 is provided on the uppermost electrode layer 70, and an insulating layer 43 is provided on the insulating layer 42. The insulating layer 43 covers the upper ends of the columnar portions CL1.

Figure 5:
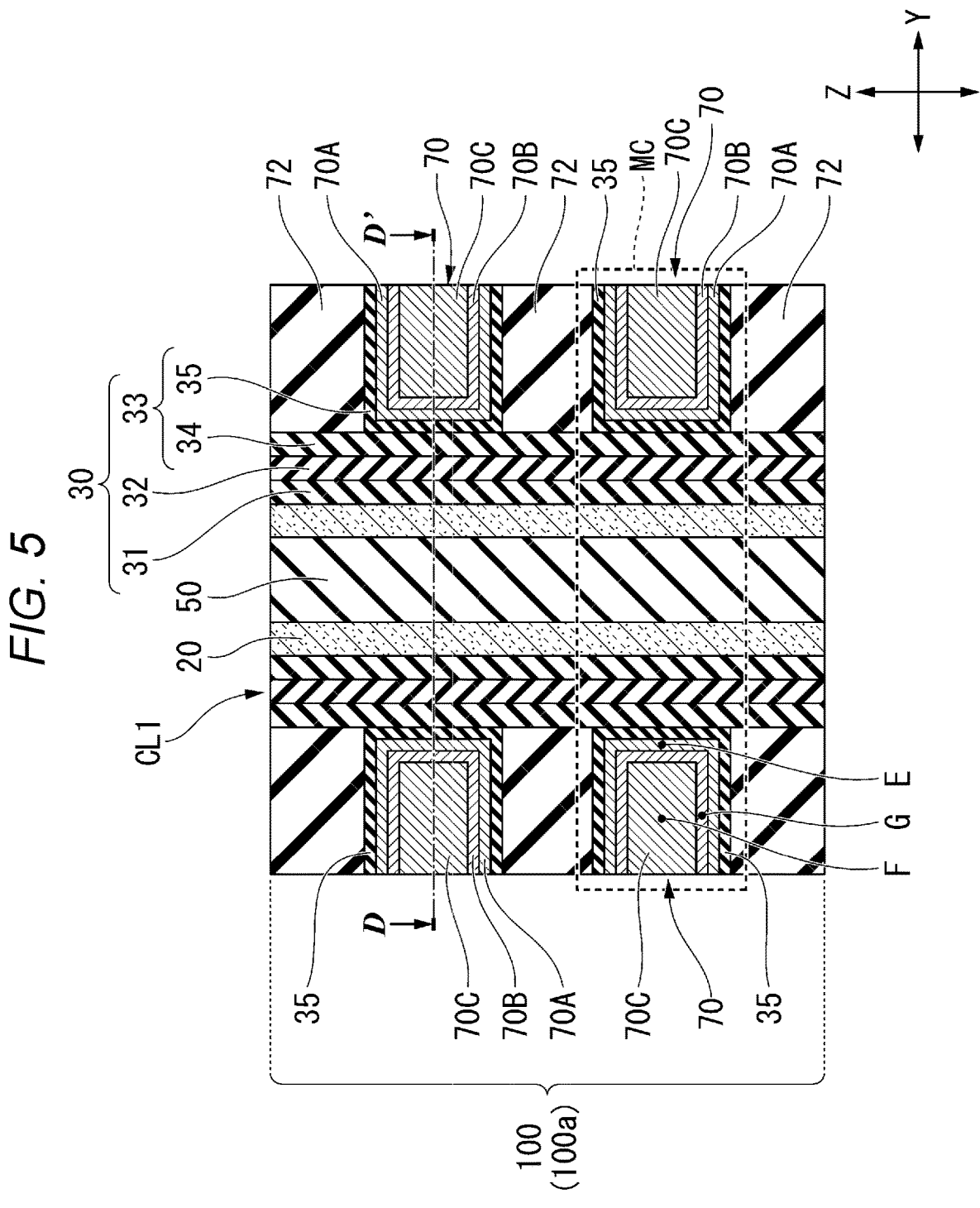
FIG. 5 is an enlarged cross-sectional view of a portion of the columnar portion shown in FIG. 4.

FIG. 5 is an enlarged cross-sectional view of a portion of the columnar portion CL1, shown in FIG. 4, and a surrounding area.

Figure 6:
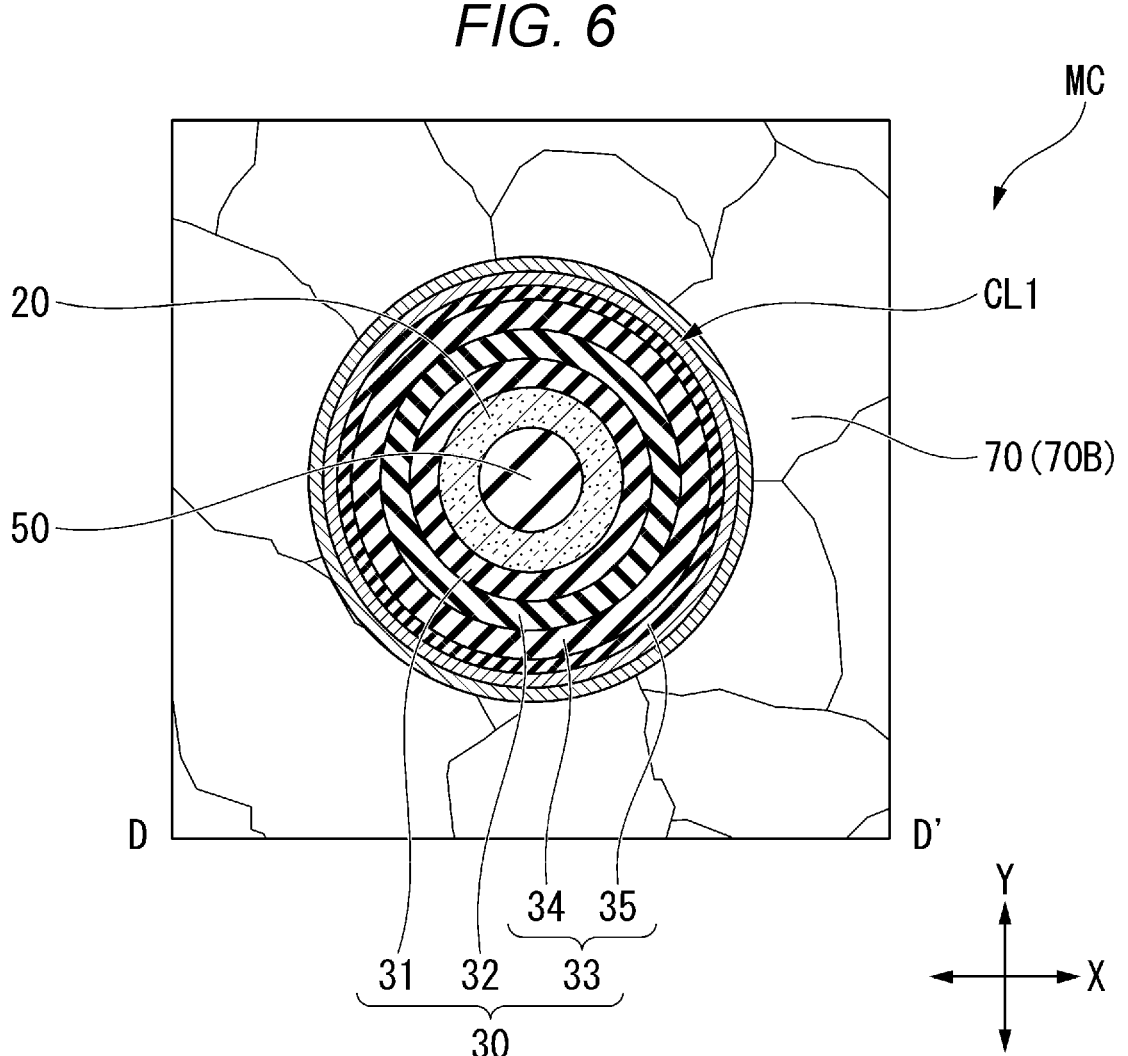
FIG. 6 is a cross-sectional view along the line D-D' of FIG. 5, illustrating the columnar portion and the electrode layer shown in FIG. 5.

FIG. 6 is a cross-sectional view along the line D-D' of FIG. 5.

The columnar portion CL1 includes a stacked film (memory film) 30, a semiconductor body 20, and an insulating core portion 50.

The semiconductor body 20 extends continuously and annularly in the first stacked portion 100a in the stacking direction (Z direction). The stacked film 30 is provided between the electrode layers 70/insulating layers 72 and the semiconductor body 20, and covers the outer periphery of the semiconductor body 20. The core portion 50 is provided inside the annular semiconductor body 20. The core portion 50 may include a not-shown hollow space. The upper end of the semiconductor body 20 is connected to a bit line BL via the contact Cb and the contact V1 shown in FIG. 3.

The stacked film 30 includes a tunnel insulating film 31, a charge storage film (memory portion) 32, and a block insulating film 33. The tunnel insulating film 31, the charge storage film 32, and the block insulating film 33 are provided in this order between the semiconductor body 20 and the electrode layers 70, with the tunnel insulating film 31 located closest to the semiconductor body 20. The charge storage film 32 is provided between the tunnel insulating film 31 and the block insulating film 33.

As shown in FIG. 4, in the lower end portion CLE of each lower columnar portion LCL1, the tunnel insulating film 31, the charge storage film 32 and the block insulating film 33 are partly removed in an area in contact with the source line 10b. Consequently, a connecting portion 24 has been formed in part of the side surface of the semiconductor body 20. The semiconductor body 20, in the connecting portion 24 facing the source line 10b, is in direct contact with the source line 10b.

The semiconductor body 20, the stacked film 30 and each electrode layer 70 constitute a memory cell MC. The memory cell MC has a vertical transistor structure in which the electrode layer 70 surrounds the periphery of the semiconductor body 20 via the stacked film 30.

In the memory cell MC having a vertical transistor structure, the semiconductor body 20 is a channel body made of, for example, silicon, and the electrode layer 70 functions as a control gate. The charge storage film 32 functions as a data storage layer for storing charges injected from the semiconductor body 20.

The semiconductor memory device MR of this embodiment is a non-volatile semiconductor memory device.

The memory cell MC is, for example, a charge-trapping memory cell. The charge storage film 32 has, in the insulating film, many trapping sites for trapping charges and is, for example, a silicon nitride film. Alternatively, the charge storage film 32 may be a conductive floating gate surrounded by an insulator.

The tunnel insulating film 31 serves as a potential barrier when charges are injected from the semiconductor body 20 into the charge storage film 32, or when charges, stored in the charge storage film 32, are emitted into the semiconductor body 20. The tunnel insulating film 31 is, for example, a silicon oxide film.

The block insulating film 33 prevents charges, stored in the charge storage film 32, from being emitted to the electrode layer 70. Furthermore, the block insulating film 33 prevents back-tunneling of charges from the electrode layer 70 to the columnar portion CL1.

The block insulating film 33 includes, for example, a first block film 34 and a second block film (insulating film) 35. The first block film 34 is, for example, a silicon oxide film. The second block film 35 is, for example, a metal oxide film having a higher dielectric constant than a silicon oxide film. The metal oxide film may be, for example, an aluminum oxide film, a zirconium oxide film, or a hafnium oxide film.

The first block film 34 is provided between the charge storage film 32 and the second block film 35. The second block film 35 is provided between the first block film 34 and the electrode layer 70.

The second block film 35 is also provided between the electrode layer 70 and the insulating layer 72. The second block film 35 is formed continuously along the upper surface, and the lower surface of the electrode layer 70 and the stacked film 30-side side surface. The second block film 35 is not continuous but intermittent in the stacking direction of the first stacked portion 100a.

The second block film 35 may be formed continuously in the stacking direction of the first stacked portion 100a without forming the second block film 35 between the electrode layer 70 and the insulating layer 72. Alternatively, the block insulating film 33 may be a single-layer film which extends continuously in the stacking direction of the first stacked portion 100a.

A metal nitride film may be formed between the second block film 35 and the electrode layer 70, or between the insulating layer 72 and the electrode layer 70. The metal nitride film is, for example, a titanium nitride film, and can function as a barrier metal, an adhesive layer, or a seed metal of the electrode layer 70.

As shown in FIG. 3, a drain-side select transistor STD is provided in the upper group 100aU of the first stacked portion 100a (at the upper ends of the columnar portions CL1). A source-side select transistor STS is provided in the lower group 100aL of the first stacked portion 100a. At least the uppermost electrode layer 70 functions as a control gate of the drain-side select transistor STD. At least the lowermost electrode layer 70 functions as a control gate of the source-side select transistor STS.

A plurality of memory cells MC are provided between the drain-side select transistor STD and the source-side select transistor STS. The drain-side select transistor STD, the memory cells MC and the source-side select transistor STS are connected in series through the semiconductor body 20 of each columnar portion CL1 and constitute one memory string. The memory strings are arranged, for example, in a zigzag pattern in a planal direction parallel to the XY plane. The memory cells MC are provided three-dimensionally in the X, Y and Z directions.

The configuration of the insulating portions (separating portions) 60 will now be described.

As shown in FIGS. 2 and 4, each insulating portion 60 is comprised of an insulating film 63. Depiction of the insulating film 63 is omitted from FIG. 3.

The insulating film 63 extends in the X and Z directions. For example, as shown in FIG. 4, the insulating film 63 is located adjacent to the first stacked portion 100*a*, and extends in the Z direction and reaches an upper portion of the semiconductor layer 10*a*.

As described previously, the lower end of the semiconductor body 20 of each columnar portion CL1, shown in FIG. 4, is in contact with the source line 10*b*.

The staircase portions 2 will now be outlined.

Each staircase portion 2 is divided by the insulating portions 60 into parts of the string units 200. Each staircase portion 2 includes a terrace portion 70*a* and has columnar portions CL1 and contact portions CT.

<Detailed Structure of Electrode Layer>

The electrode layer 70 is a metal layer of molybdenum. In particular, as shown in FIG. 5, the electrode layer 70 includes an initial layer 70A located inside the second block film 35, a first bulk layer 70B located inside the initial layer 70A, and a second bulk layer 70C located inside the first bulk layer 70B. In other words, the electrode layer 70 includes the second bulk layer 70C, which is located at an innermost position and may be also referred to as a core layer, the first bulk layer 70B that externally covers the second bulk layer 70C, and the initial layer 70A that externally covers the first bulk layer 70B. The initial layer 70A is formed inside the second block film 35 and is in contact with it.

Chlorine is contained in the electrode layer 70 composed of the initial layer 70A, the first bulk layer 70B and the second bulk layer 70C. The electrode layer 70 has a chlorine concentration gradient such that the concentration of chlorine is high at a side close to the second block film 35 and decreases with distance from the second block film 35.

In particular, the electrode layer 70 has a chlorine concentration gradient such that the chlorine atom concentration (chlorine concentration) is high in the initial layer 70A at a position near the second block film 35, and the chlorine concentration gradually decreases in a direction away from the second block film 35 toward the first bulk layer 70B, or toward the second bulk layer 70C.

For example, in the cross-section shown in FIG. 5, a chlorine concentration gradient is created such that the chlorine concentration is lower at a position F in the second bulk layer 70C, located centrally in the thickness direction of the second bulk layer 70C, than at any position E in the initial layer 70A, and that the chlorine concentration gradually decreases in a direction from the position E toward the position F. Further, assume that a position G in the first bulk layer 70B is located in the Z direction with respect to the position F in FIG. 5. A chlorine concentration gradient is created such that the chlorine concentration is lower at the position F than at the position G, and that the chlorine concentration gradually decreases in a direction from the position G toward the position F.

The electrode layers 70 are formed by the below-described replacement process.

The replacement process refers to a process which, in the case of forming the stacked body 100, comprises the steps of: forming a stacked body composed of not-shown sacrificial layers and insulating layers 72; forming columnar portions CL1 in the stacked body; subsequently forming slit holes for the formation of insulating films 63; subsequently removing the sacrificial layers by etching through the slit holes; and filling an electrode material into cavities, which are formed by the removal of the sacrificial layers, thereby forming electrode layers 70. Prior to the formation of the electrode layers 70, second block films 35 are formed in the cavities which are formed by the removal of the sacrificial layers. The second block films 35 may be formed with a thickness of, for example, about 2 nm to 3 nm.

In advance of the step of forming the electrode layers 70, a step of forming the source line 10*b* is carried out. In this step, prior to the formation of the source line 10*b*, a sacrificial film for the source line is formed in a source line-10*b* formation area, and the above-described slit holes are formed such that they reach the sacrificial film for the source line. Thereafter, the sacrificial film for the source line is removed by etching through the slit holes, and then a material for the source line 10*b* is filled into the cavities formed by the removal of the sacrificial film, thereby forming the source line 10*b*.

<Electrode Layer Production Method>

To form the electrode layers 70 in the above-described replacement process, it is necessary to fill an electrode material into the cavities which are relatively very thin in the Z direction, and extend relatively wide in the X and Y directions.

In this embodiment, a film-forming method such as ALD (atomic layer deposition) is used for the formation of the electrode layers 70. As described above, the electrode layers 70 are formed of molybdenum. Thus, a molybdenum film may be formed by ALD. When a molybdenum film is formed by ALD, the initial layer 70A is formed in the initial stage of film formation, then the first bulk layer 70B is formed based on the initial layer 70A, and then the second bulk layer 70C is formed.

In the above-described replacement process, a film is formed in the cavities after the removal of the sacrificial layers and the formation of the second block films 35. In this manner, the initial layer 70A, the first bulk layer 70B and the second bulk layer 70C can be formed sequentially. Thus, as illustrated in detail in FIG. 5, a structure in which the cavity is filled with the second block film 35, the initial layer 70A, the first bulk layer 70B and the second bulk layer 70C can be obtained.

When a molybdenum film is formed by ALD, the film is formed in an atmosphere at 500° C. to 650° C. using a raw material gas containing molybdenum, generated from a fluorine-free raw material, and also using a reducing gas such as hydrogen or ammonia. The film can be formed by deposition using, for example, a vapor of molybdenum oxide pentachloride or molybdenum dichloride dioxide.

The initial layer 70A is a layer deposited in a reducing atmosphere of ammonia gas using molybdenum nitride for nuclear growth in the initial stage of the formation of a molybdenum film. The first bulk layer 70B is formed with the molybdenum nitride film as a nucleus. The initial layer 70A is a film for promoting the stable growth of the first bulk layer 70B. Therefore, the initial layer 70A is not essential, though it is preferably formed. It is possible to omit the initial layer 70A and first form the first bulk layer 70B in direct contact with the second block film (insulating film) 35. The provision of the initial layer 70A can achieve good adhesion to the second block film 35 as compared to the case of directly forming the first bulk layer 70B.

The first bulk layer 70B can be formed at a temperature which is lower by about 100° C. to 180° C. than the below-described temperature for the formation of the second bulk layer 70C.

The formation of the first bulk layer 70B can be performed by deposition at the following temperature using the above-described raw material gas and hydrogen as a reducing gas.

For example, the first bulk layer 70B can be formed at a temperature in the range of 350° C. to 550° C., for example, at 450° C.

The second bulk layer 70C can be formed at a temperature in the range of 450° C. to 700° C., for example, at 614° C.

The formation of the second bulk layer 70C can be performed by using the above-described raw material gas and reducing gas, and only changing the temperature conditions from those for the formation of the first bulk layer 70B.

When the first bulk layer 70B is formed in the above-described manner, the first bulk layer 70B contains a considerable amount of impurities and has a near-amorphous quality. The low-temperature formation of the first bulk layer 70B has the effect of canceling the crystallinity and roughness of the underlying layers, namely the second block film 35, for example, made of $Al_2O_3$ and the initial layer 70A. In addition, an annealing effect is produced by allowing the second bulk layer 70C to grow at a temperature which is higher by at least 100° C. than that in the formation of the first bulk layer 70B. The annealing effect can increase the size of the crystal grains. While the first bulk layer 70B formed, as it is, has a near-amorphous quality, the first bulk layer 70B becomes crystalline when it is subjected to a heat history such as the formation of the second bulk layer 70C after film formation.

Since the first bulk layer 70B is formed at a temperature lower than that in the formation of the second bulk layer 70C and there is a problem of impurity contamination, the thickness of the first bulk layer 70B is preferably made as small as possible. For example, the first bulk layer 70B may be formed with a thickness of not more than 5 nm, for example, about 2 to 5 nm.

Figure 7:
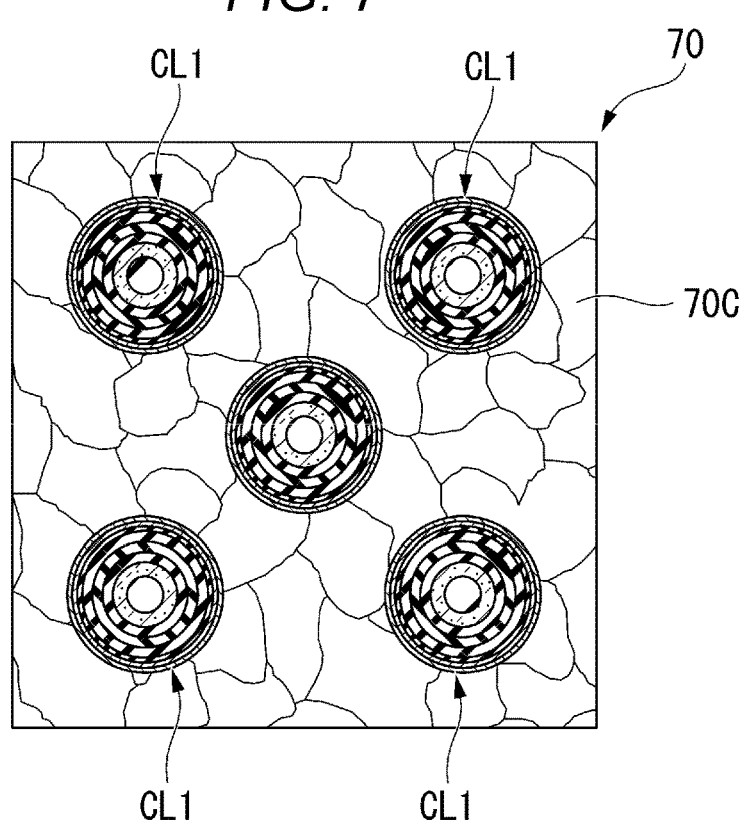
FIG. 7 is an enlarged schematic view of a portion illustrating columnar portions and an electrode layer formed around the columnar portions and composed of crystal grains having a large grain size.

The above-described film forming conditions make it possible to form the second bulk layer 70C such that it has a grain size of not less than 14.5 nm (not less than 145 angstroms). For example, as shown by the below-described test results, the second bulk layer 70C having an average crystal grain size of about 14.5 to 16.5 nm (145 to 165 angstroms) can be obtained. FIG. 7 is a cross-sectional view in the same cross section as that of FIG. 6, and illustrates 5 columnar portions CL1 and crystal grains of the second bulk layer 70C in an area around the columnar portions CL1.

The average crystal grain size of the second bulk layer 70C can be determined, for example, by a method which observes crystal grains which exist in at least 20 areas, each having an area of 100 nm², of the second bulk layer 70C in the cross-section of FIG. 7 and determines the average crystal grain size for the number of the crystal grains existing in each of these areas.

Figure 8:
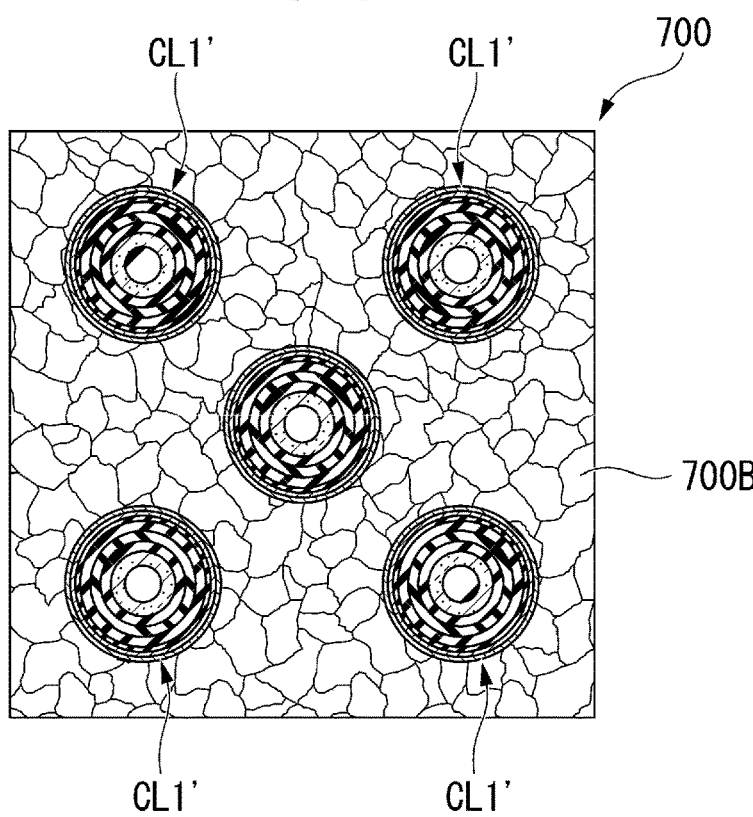
FIG. 8 is a schematic view illustrating columnar portions and an electrode layer formed around the columnar portions and composed of crystal grains having a small grain size.

FIG. 8 illustrates crystal grains of an electrode layer 700 obtained by forming a molybdenum film at 614° C. from the beginning to the end without performing above-described two-stage (450° C. and 614° C.) temperature control.

When a molybdenum film is formed at 614° C. throughout the process, an initial layer and a bulk layer are formed. As shown in FIG. 8, the average crystal grain size of the bulk layer 700B formed is smaller than that of the second bulk layer 70C shown in FIG. 7.

The number of crystal grain boundaries is larger in the bulk layer 700B having a small average crystal grain size as shown in FIG. 8 than in the second bulk layer 70C shown in FIG. 7 when comparison is made with the same area. When another film is formed after the formation of the bulk layer 700B having a large number of crystal grain boundaries, and the film is subjected to, for example, a heat treatment, impurities existing around the crystal grain boundaries will be easily diffused through the boundaries. The increased diffusion of impurities may cause deterioration of properties necessary for the semiconductor memory device.

In the case of the semiconductor memory device MR having a three-dimensional structure, shown in FIGS. 1 through 7, the electrode layer 70 functions as a control gate that controls charges stored in the charge storage film 32. The structure having the second bulk layer 70C, shown in FIG. 7, can stabilize a threshold voltage as compared to the structure having the bulk layer 700B, shown in FIG. 8.

On the other hand, in the case of a semiconductor memory device having the bulk layer 700B with a small average crystal grain size, shown in FIG. 8, diffusion of an impurity element from the bulk layer 700B into the surrounding area may proceed, resulting in the formation of a defect in the adjacent second block film 35. When there are many defects in the second block film 35, there will be a disturbance of a threshold voltage, which may deteriorate the high-temperature data retention property of the semiconductor memory device.

Figure 9:
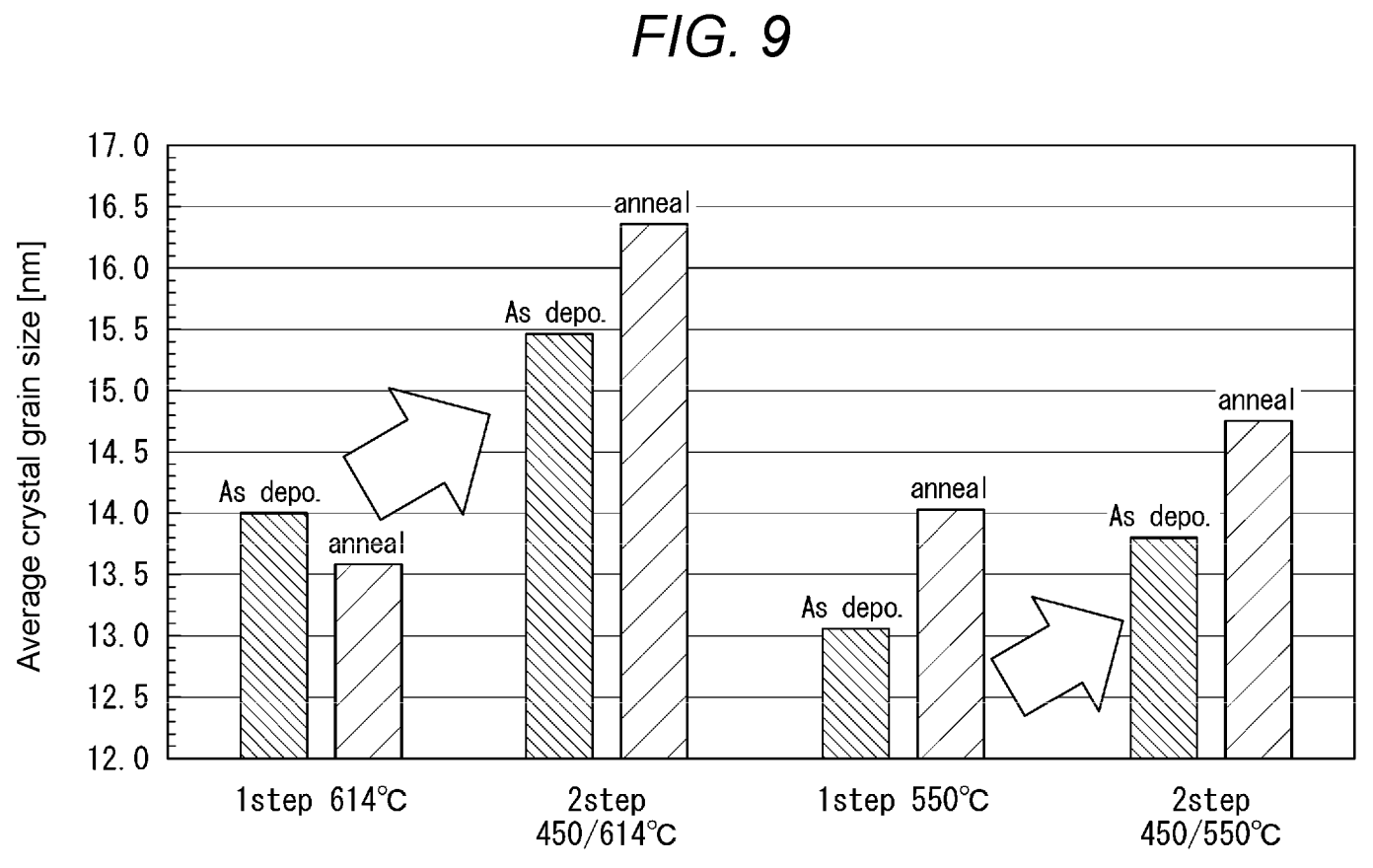

FIG. 9 shows the results of measurement of the average crystal grain size (nm) of an electrode layer of molybdenum, formed by ALD on a second block film (insulating film) of $Al_2O_3$.

When a molybdenum electrode layer is formed by ALD under the above-described two-stage temperature control, the electrode layer has a three-layer structure composed of an initial layer, a first bulk layer and a second bulk layer.

In this example, after forming an initial layer with a thickness of about 5 nm, a first bulk layer was formed with a thickness of about 5 nm, and then a second bulk layer was formed with a thickness of about 15 nm.

When a molybdenum film (electrode layer) was formed at a constant (fixed) temperature of 614° C., the resulting layer had a two-layer structure composed of an initial layer and a bulk layer. The average crystal grain size of the bulk layer as formed was 14.0 nm.

After annealing the electrode layer at 750° C., the bulk layer had a reduced average crystal grain size of 13.6 nm.

An electrode layer was formed while controlling the film-forming temperature in two stages at 450° C. and 614° C.: a first bulk layer having a thickness of 5 nm was formed at 450° C. on an initial layer having a thickness of 5 nm, and subsequently a second bulk layer having a thickness of 15 nm was formed at 614° C.

The average crystal grain size of the second bulk layer as formed was 15.5 nm. After annealing the electrode layer at 750° C., the second bulk layer had an increased average crystal grain size of 16.3 nm.

An electrode layer composed of an initial layer and a bulk layer was formed at a fixed temperature of 550° C. The average crystal grain size of the bulk layer was 13.1 nm.

An electrode layer was formed while controlling the film-forming temperature in two stages at 450° C. and 550° C.: a first bulk layer having a thickness of about 5 nm was formed at 450° C. on an initial layer having a thickness of about 5 nm, and subsequently a second bulk layer having a thickness of 15 nm was formed at 550° C.

The average crystal grain size of the second bulk layer as formed was 13.8 nm. After annealing the electrode layer at 750° C., the second bulk layer had an increased average crystal grain size of 14.8 nm.

The results shown in FIG. 9 indicate that when an electrode layer of molybdenum is formed by ALD, an electrode layer including a second bulk layer having a large average crystal grain size can be formed by forming a first bulk layer at a low temperature and forming the second bulk layer at a high temperature.

Further, as will be appreciated from comparison of the data for 450° C./614° C. with the data for 450° C./550° C., when forming a first bulk layer and a second bulk layer, the first bulk layer is preferably formed at a temperature which is lower by at least 100° C. than that in the formation of the second bulk layer.

As described above, when a molybdenum film is formed under two-stage temperature control, an annealing effect will be exerted on the first bulk layer during the high-temperature formation of the second bulk layer, contributing to an increase in the average crystal grain size. The first bulk layer is likely to contain a relatively large amount of impurities. Therefore, the thickness of the first bulk layer is preferably made as small as possible, for example, not more than 5 nm.

Figure 10:
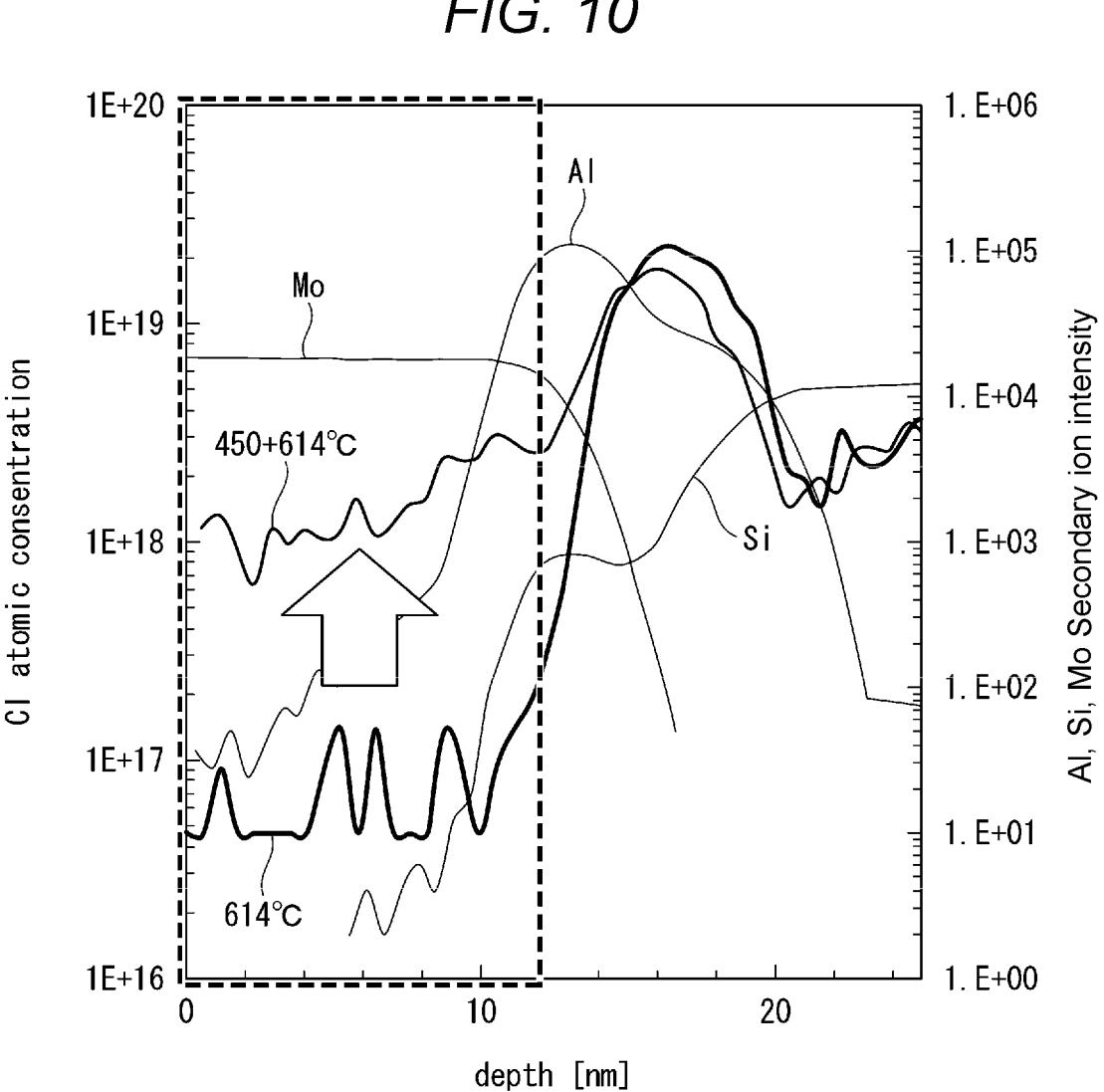
FIG. 10 is a graph showing a chlorine concentration distribution in an insulating film and in an electrode layer, and the secondary ion intensity distributions of Al, Si and Mo in the insulating film and in the electrode layer.

FIG. 10 shows the results of an elemental analysis of an area, ranging from a second block film through an initial layer to a first bulk layer, of an electrode layer of molybdenum, formed by ALD on the second block film of $Al_2O_3$.

The left ordinate axis of FIG. 10 represents chlorine atom concentration (atoms/cm$^3$), and the right ordinate axis of FIG. 10 represents the secondary ion intensities (count/sec) of Al, Si and Mo. The abscissa axis of FIG. 10 represents depth (unit: nm). The chlorine atom concentration and the secondary ion intensities were measured by SIMS (secondary ion mass) spectroscopy.

As can be seen in FIG. 10, the second block film ($Al_2O_3$) corresponds to an area where the secondary ion intensity of Al is high, and the initial layer and the first bulk layer correspond to an area where the secondary ion intensity of Al decreases and the secondary ion intensity of Mo is stabilized.

It can be presumed that in FIG. 10, the initial layer of molybdenum corresponds to an area where the secondary ion intensities of Al and Si begin to decrease, and the secondary ion intensity of Mo is soon to be stabilized.

In FIG. 10, for clear illustration and emphasis, an area with a width (thickness) of about 12 nm, ranging from a position, which is presumed to corresponds to the initial layer of molybdenum, to the first bulk layer and the second bulk layer, is enclosed by the dashed-line rectangle. The position of the right-side dashed line, indicating the right end of the area enclosed by the dashed-line rectangle, can be regarded as the interface between the second block film and the initial layer.

FIG. 10 shows the results of the measurement of the chlorine atom concentration of the electrode layer formed under the above-described 450° C./614° C. two-stage temperature control conditions. FIG. 10 also shows the results of the measurement of the chlorine atom concentration of the electrode layer formed under the above-described 614° C. single-stage temperature control conditions.

In the area enclosed by the dashed-line rectangle shown in FIG. 10, the initial layer and the first bulk layer of the electrode layer formed under the two-stage temperature control have an average chlorine concentration of about $1×10^{+18}$ (atoms/cm$^3$). The initial layer and the bulk layer of the electrode layer formed under the single-stage temperature control have an average chlorine concentration at a level slightly lower than $1×10^{+17}$ (atoms/cm$^3$).

As can be seen in FIG. 10, the initial layer, the first bulk layer and the second bulk layer of the electrode layer formed under the two-stage temperature control have a chlorine concentration gradient such that the chlorine atom concentration (chlorine concentration) is higher at a position nearer to the second block film, i.e., the chlorine concentration gradually decreases with distance from the second block film.

As can be seen in FIG. 10, the first bulk layer and the second bulk layer of the electrode layer formed under the two-stage temperature control have a higher chlorine concentration than the bulk layer of the electrode layer formed under the single-stage temperature control. The chlorine contained in each of the electrode layers is considered to be derived from a chlorine-containing raw material gas used to form the molybdenum film (electrode layer).

When a molybdenum film is formed under the 450° C./614° C. two-stage temperature control conditions, the growth state of the film changes with the temperature, which will produce a difference in the amount of chlorine taken in the film, thus creating a chlorine concentration gradient. For example, when the film-forming temperature is low, the reducing power of a reducing gas is weak, and therefore chlorine is likely to remain in the film. In contrast, when the film-forming temperature is high, the reducing power of the reducing gas is strong, and therefore chlorine is less likely to remain in the film. Thus, the content of chlorine is likely to be low in the film formed at a high temperature. In addition, when the film formed is subjected to a heat history such as a heat treatment, chlorine will diffuse to some extent in the film, leading to a chlorine concentration distribution having a concentration gradient as shown in FIG. 10.

Accordingly, a molybdenum film, having a chlorine concentration gradient as shown in FIG. 10, is presumed to have been formed under the low temperature/high temperature two-stage temperature control. In other words, as shown in FIG. 10, the film has a chlorine concentration gradient in an area ranging from the interface between the insulating film and the initial layer (interface between the insulating film and the electrode layer) through the initial layer to the first bulk layer or the second bulk layer, and has an average chlorine concentration of not less than $1×10^{+18}$ (atoms/cm$^3$) in an area with a thickness of 10 nm.

When the initial layer is omitted, and the first bulk layer and the second bulk layer are sequentially formed on the second block film, a chlorine concentration gradient is created in an area with a thickness of 10 nm, ranging from the interface between the second block film and the first bulk layer to the first bulk layer or the second bulk layer from the interface.

Figure 11:
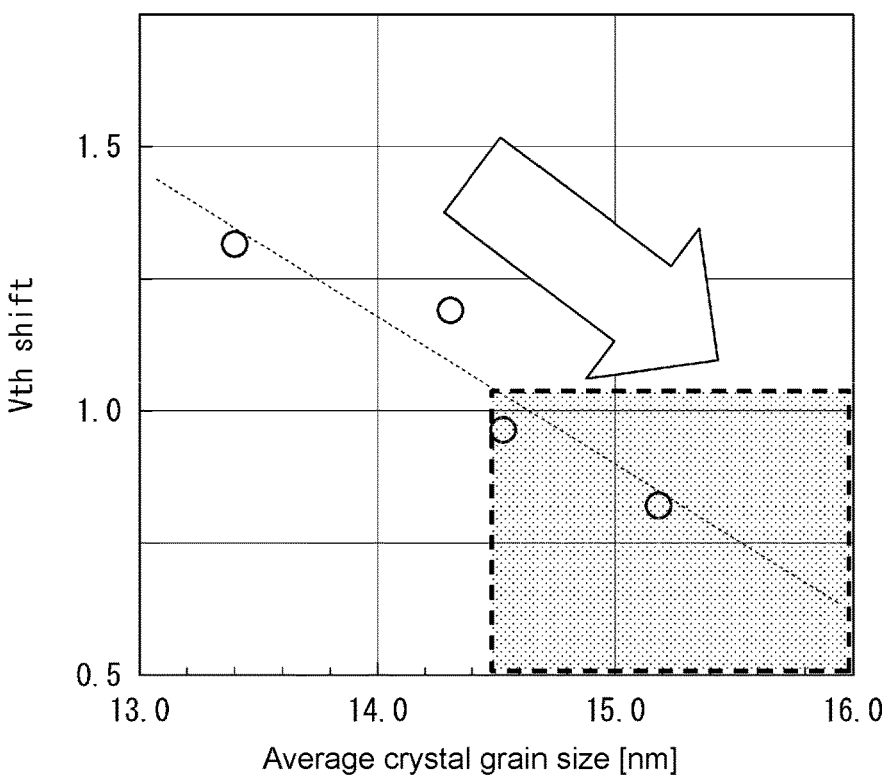
FIG. 11 is a graph showing a relationship between crystal grain size and threshold voltage.

FIG. 11 shows the results of measurement of the threshold value of a write voltage in a semiconductor memory device having the configuration shown in FIGS. 1 through 7 and having molybdenum electrode layers. FIG. 11 shows the results of data for electrode layers each having each of four types of second bulk layers with varying average crystal grain sizes: 13.4 nm, 14.3 nm, 14.5 nm and 15.2 nm in each of the above-described semiconductor memory devices.

As shown in FIG. 11, the threshold voltage decreases with increase in the average crystal grain size of the second bulk layer. Therefore, in the case of using molybdenum electrode layers, the use of a large average crystal grain size is favorable to the semiconductor memory device.

In view of the threshold voltage reducing effect, the use of an average crystal grain size of not less than 14.5 nm is considered to be effective for achieving a low threshold voltage that lies in the area enclosed by the dashed-line rectangle shown in FIG. 11.

Figure 12:
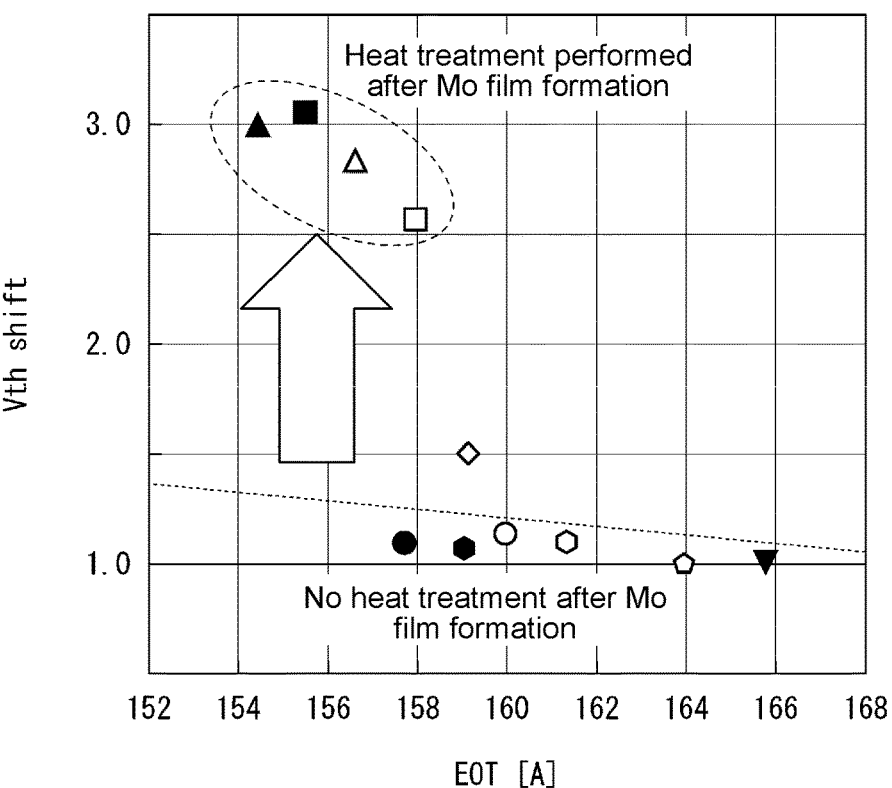
FIG. 12 is a graph showing a shift amount of threshold voltage in a molybdenum electrode layer having a related-art structure.

FIG. 12 shows the results of measurement of a threshold voltage shift in a semiconductor memory device using molybdenum electrode layers formed under 614° C. single-stage temperature control, as measured after writing information at 8V and then holding the semiconductor memory device at a high temperature of 125° C. for 15 hours.

The ordinate axis of FIG. 12 represents the shift amount, and the abscissa axis of FIG. 12 represents equivalent oxide thickness (EOT) (angstrom).

As can be seen in FIG. 12, no threshold voltage shift occurs in the molybdenum electrode layers which are not undergone a heat treatment after the formation of the electrode layers, whereas a large threshold voltage shift occurs in the molybdenum electrode layers which are subjected to a heat history such that the molybdenum electrode layers formed are heated at a temperature of not less than the Mo film-forming temperature.

The results shown in FIG. 12 indicate that the use of molybdenum electrode layers having a small average crystal grain size causes considerable diffusion of impurities, resulting in the formation of defects in the adjacent second block films, and that the high-temperature data retention property will therefore deteriorate if the molybdenum electrode layers formed are subjected to a heat history.

In a related-art common semiconductor memory device having a three-dimensional structure, its electrode layers are formed of tungsten.

Tungsten electrode layers are used because tungsten has a low electrical resistance and is frequently used as an interconnect material. However, $WF_6$ is used as a raw material gas for the formation of tungsten electrode layers. There is, therefore, a fear of diffusion of HF which can etch an unnecessary portion. On the other hand, molybdenum electrode layers have an electrical resistance comparable to tungsten electrode layers. In addition, a fluorine-free material can be used as a raw material for molybdenum. The use of such a material, which does not generate HF, does not cause the above problem.

A seed layer of TiN is generally necessary to form each tungsten electrode layer with good adhesion to a block film of aluminum oxide. On the other hand, each molybdenum electrode layer can be formed directly on a block film with good adhesion to the block film; therefore, such a seed layer is not necessary. Thus, molybdenum electrode layers have the advantage of being capable of simplifying the layer structure over tungsten electrode layers.

Features of the non-limiting embodiments and their variations described above may be combined in a desired manner.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:

a substrate; and an insulating film formed on the substrate, and an electrode layer comprising molybdenum, formed in contact with the insulating film, wherein the electrode layer includes an initial layer, a first bulk layer, and a second bulk layer arranged in such an order from the insulating film, wherein the initial layer surrounds at least two surfaces of the first bulk layer, and the first bulk layer surrounds at least two surfaces of the second bulk layer, and wherein the electrode layer has a stabilized molybdenum concentration within a distance from an interface between the insulating film and the electrode layer, with a chlorine concentration decreasing with a distance from the second bulk layer.

2. The semiconductor device according to claim 1, wherein the electrode layer has an average chlorine concentration not less than $1\times10^{+18}$ (atoms/cm$^3$) within the distance, which is equal to about 10 nm.

3. The semiconductor device according to claim 1, wherein the initial layer is located closet closest to the insulating film;

the first bulk layer is located next closest to the insulating film; and the second bulk layer is located least closest to the insulating film;

wherein the first bulk layer has a thickness not more than 5 nm; and wherein the electrode layer has an average chlorine concentration not less than $1\times10^{+18}$ (atoms/cm$^3$) within 10 nm from an interface between the insulating film and the initial layer.

4. The semiconductor device according to claim 1, wherein the electrode layer has an average crystal grain size not less than 14.5 nm.

5. A semiconductor memory device comprising:

a substrate;

a plurality of insulating layers formed on the substrate, and a plurality of electrode layers comprising molybdenum, each of the plurality of electrode layers interposed between adjacent ones of the insulating layers and including an initial layer, a first bulk layer, and a second bulk layer arranged in such an order from a corresponding one of the insulating layers, the initial layer surrounding at least two surfaces of the first bulk layer, and the first bulk layer surrounding at least two surfaces of the second bulk layer; and a columnar portion including a semiconductor body, a block film, and a charge storage film, the columnar portion extending through the electrode layers and the insulating layers, wherein the electrode layers each have a stabilized molybdenum concentration within a distance from an interface between the insulating film and the electrode layer, with a chlorine concentration decreasing with a distance from the second bulk layer.

6. The semiconductor memory device according to claim 5, wherein each of the electrode layers has an average chlorine concentration not less than $1\times10^{+18}$ (atoms/cm$^3$) within the distance, which is equal to about 10 nm.

7. The semiconductor memory device according to claim 5, wherein each of the electrode layers has an average crystal grain size not less than 14.5 nm.

\* \* \* \* \*